(12) United States Patent
Liu et al.

(10) Patent No.: US 12,713,862 B2
(45) Date of Patent: Aug. 18, 2026

(54) COVER ASSEMBLY OF SEMICONDUCTOR MANUFACTURING TOOL

(71) Applicant: TAIWAN SEMICONDUCTOR MANUFACTURING COMPANY LTD., Hsinchu (TW)

(72) Inventors: Yung-Tsun Liu, Taipei City (TW); Sung-Ju Huang, Taipei City (TW); Kuang-Wei Cheng, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 129 days.

(21) Appl. No.: 18/650,139

(22) Filed: Apr. 30, 2024

(65) Prior Publication Data

US 2025/0336689 A1 Oct. 30, 2025

(51) Int. Cl.
*H10P 72/00* (2026.01)

(52) U.S. Cl.
CPC ................................ *H10P 72/0402* (2026.01)

(58) Field of Classification Search
CPC .................................................. H10P 72/0402
USPC ........................................................ 165/121
See application file for complete search history.

(56) References Cited

FOREIGN PATENT DOCUMENTS

| CN | 107429393 A | * 12/2017 | ....... C23C 16/45565 |
|---|---|---|---|
| JP | 2009152634 A | * 7/2009 | |
| JP | 2016004857 A | * 1/2016 | |

* cited by examiner

*Primary Examiner* — Steve S Tanenbaum
(74) *Attorney, Agent, or Firm* — WPAT LAW; Anthony King

(57) ABSTRACT

A gas intake apparatus, configured to provide a gas to flow into an interior space a cover that covers a process chamber cap of a semiconductor manufacturing tool is provided. In one embodiment, the gas intake apparatus comprises a deflector configured to be positioned on a sidewall of the cover and a fan device configured to provide the gas to pass through the deflector. The fan device is configured to direct the gas to flow in a first direction towards the deflector. The deflector is configured to direct the gas from the fan device to flow in a second direction into the interior space of the cover. The first direction is different from the second direction.

20 Claims, 8 Drawing Sheets

COVER ASSEMBLY OF SEMICONDUCTOR MANUFACTURING TOOL

BACKGROUND

Semiconductor processing, including chemical vapor deposition (CVD), atomic layer deposition (ALD), and the like, is commonly used for forming thin films of materials on substrates, such as silicon wafers. In a CVD process, high temperatures are achieved through the use of heating systems, which may include resistive heaters, infrared lamps, or induction heating coils that directly heat the substrate or the reaction chamber. This heating is essential to break down the gaseous precursors into reactive species that can deposit onto the substrate, forming the desired thin film. The chemical reactions involved in the deposition process are thermally activated and require specific temperatures, often ranging from several hundred to several thousand degrees Celsius, depending on the materials being deposited and the quality of the film desired. Additionally, in variants like Plasma-Enhanced CVD (PECVD), the introduction of plasma generates additional heat due to ion collisions and excitation processes, further elevating the temperature within the chamber. This thermal environment is critical not only for facilitating the necessary chemical reactions but also for ensuring the deposited films have the proper structure and properties for semiconductor applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
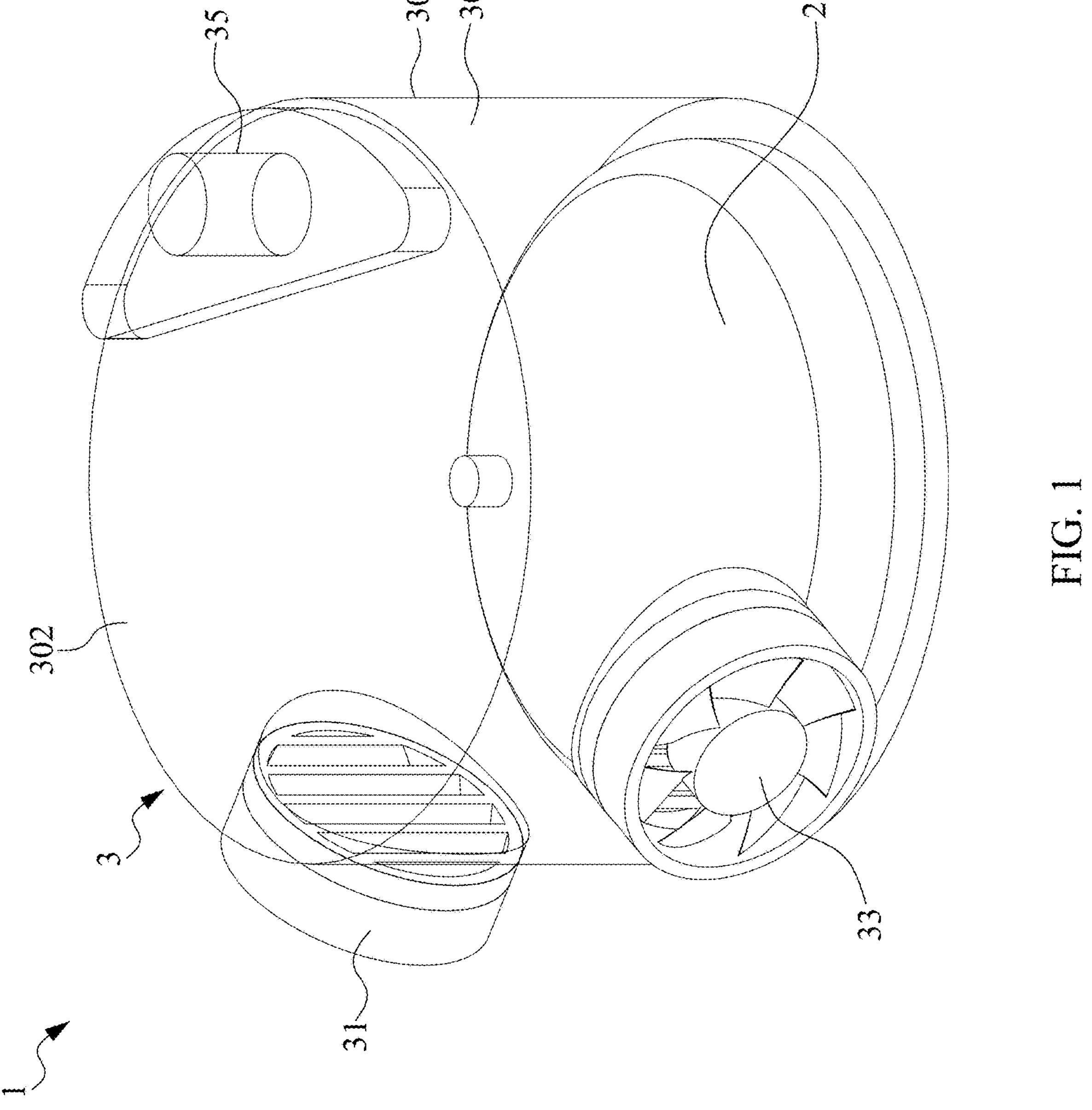
FIG. 1 is a schematic perspective view of a semiconductor manufacturing tool, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

Chemical vapor deposition (CVD) is commonly used in integrated circuit fabrication processes. The CVD may be plasma-enhanced CVD (PECVD). In many PECVD devices, a semiconducting wafer substrate is inserted into a deposition/reaction chamber. A process chamber cap, such as a quartz dome, often encapsulates the space where the chemical reactions take place. The high temperatures in the process chamber cap are primarily generated by the plasma in PECVD processes. This plasma is created by applying RF (radio frequency) power to the gas mixture, which ionizes the gases and generates heat through ion collisions and the excitation of molecules. Additionally, the heating elements surrounding the process chamber cap or embedded within the walls of the cap directly heat the dome. These elements raise the temperature to the necessary levels for the deposition reactions to occur efficiently. The quartz material of the process chamber cap, being resistant to high temperatures and chemical reactions, is ideal for containing the process. However, the energy input from the plasma and the heating elements inevitably causes the temperature inside the process chamber cap to rise significantly, facilitating the deposition of thin films on the wafer substrate by breaking down the precursor gases into reactive species that adhere to the substrate, forming the desired layers. This combination of plasma energy and direct heating ensures that the environment within the process chamber cap reaches the high temperatures required for successful CVD processes.

Present disclosure provides a cover assembly of a semiconductor manufacturing tool. The cover assembly is configured to cover and/or surround a process chamber cap, which is structured to define a space suitable for performing CVD or PECVD processes. The cover assembly may include an air-cooling system, and the air cooling system may be used for heat dissipation and cooling of the process chamber cap.

FIG. 1 is a schematic perspective view of the semiconductor manufacturing tool 1, in accordance with some embodiments of the present disclosure. As shown in FIG. 1, the semiconductor manufacturing tool 1 may include a process chamber cap 2 and a cover assembly 3. In some embodiments of the present disclosure, the semiconductor manufacturing tool 1 may perform chemical vapor deposition (CVD) processes, for example, plasma enhanced CVD (PECVD) processes or high-density plasma CVD (HDP-CVD) processes, or atomic layer deposition (ALD) processes to deposit one or more layers. The process chamber cap 2 is configured to define a space of the process chamber, where the chemical reactions take place. In some embodiments of the present disclosure, the process chamber cap 2 includes a quartz dome.

As shown in FIG. 1, the cover assembly 3 is configured to cover the process chamber cap 2. The cover assembly 3 may include a cover body 30, and the cover body 30 may include a sidewall 301 surrounding the process chamber cap 2 and an upper portion 302 connecting the sidewall 301 and arranged above the process chamber cap 2. The cover assembly 3 may be a robust structure typically used to physically protect the dome from external environmental impacts and provide safety protection for operators. The cover assembly 3 may be made from materials resistant to high temperatures and corrosion, such as aluminum, stainless steel or special alloys.

Figure 2:
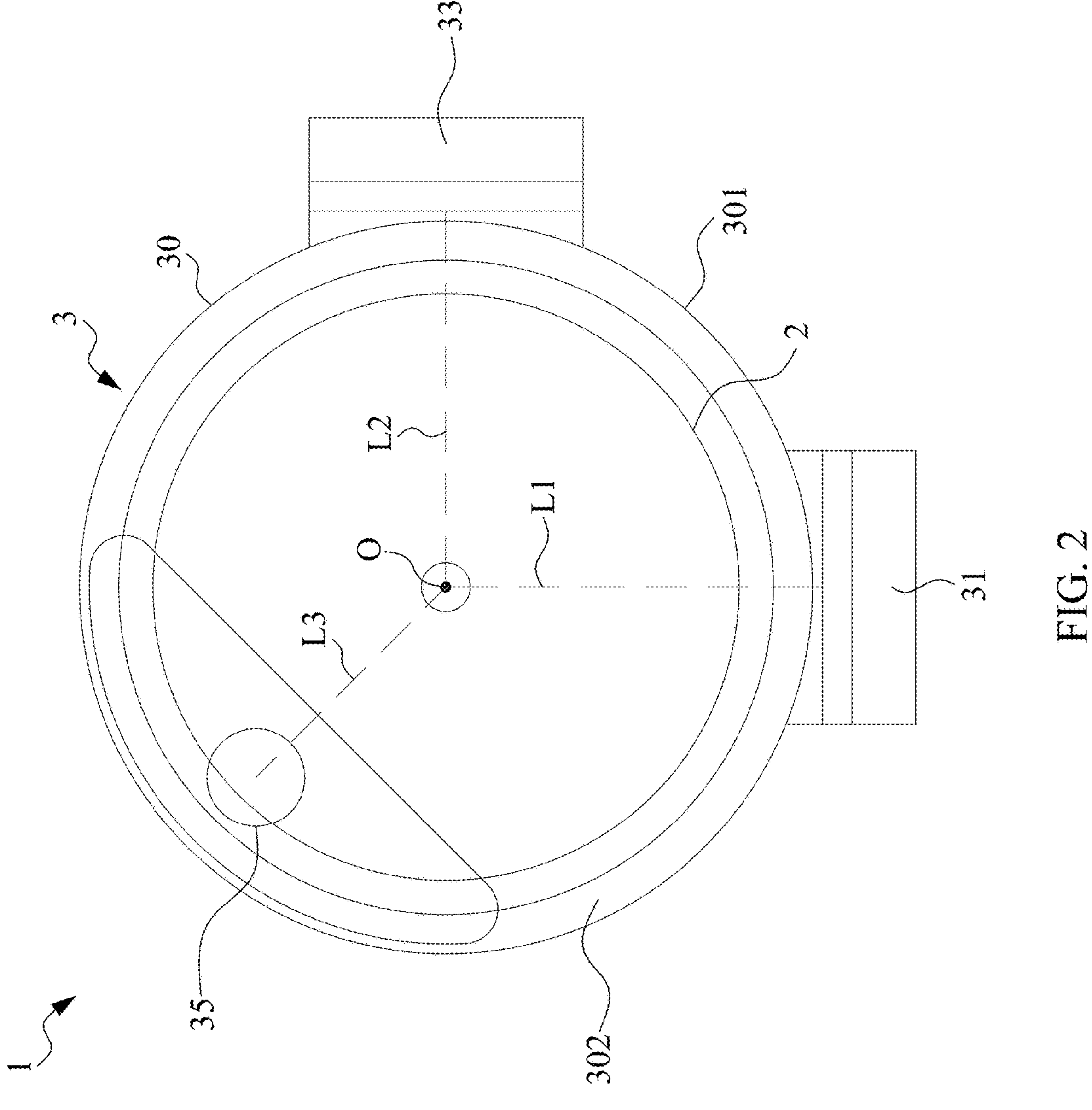
FIG. 2 is a schematic top view of a semiconductor manufacturing tool 1, in accordance with some embodiments of the present disclosure.

The cover assembly 3 may include an air-cooling system, and such air-cooling system may be configured to be used for cooling and heat dissipation of the process chamber cap 2. As shown in FIG. 2, the cover assembly 3 may include two gas intake apparatuses 31, 33 and a gas outlet 35. The gas intake apparatuses 31, 33 may be disposed at the sidewall 301 of the cover body 30, and the gas outlet may be disposed at the upper portion 302 of the cover body 30. The gas intake apparatus 31, 33 is configured to introduce a cooling gas into the interior space of the cover body 30, thereby utilizing the cooling gas to dissipate heat and cool the process chamber cap 2 covered by the cover assembly 3. The gas outlet 35 is configured to expel the gas from the interior space of the cover body 30, thereby also venting the heat dissipated from the process chamber cap 2.

FIG. 2 is a schematic top view of the semiconductor manufacturing tool 1, in accordance with some embodiments of the present disclosure. As shown in FIG. 2, the process chamber cap 2 may be substantially circular. The sidewall 301 of the cover body 30 may surround the process chamber cap 2. Thus, the cover body 30 may also be circular. The gas intake apparatuses 31 and 33 are disposed at the sidewall 301 of the cover body 30 and the gas outlet 35 is disposed above the process chamber cap 2 and adjacent to the sidewall 301 of the cover body 30. Referring to FIG. 2, the gas intake apparatus 31 may be disposed at the middle of the bottom side of the sidewall 301, and the gas intake apparatus 33 may be disposed at the middle of the right side of the sidewall 301. That is, from a top view perspective, an angle between a line L1 connecting a center of the gas intake apparatus 31 with a center O of the upper portion 302 of the cover body 30 and a line L2 connecting a center of the gas intake apparatus 33 with the center O of the upper portion 302 of the cover body 30 may be approximately 90 degrees. In some embodiments, the angle may range between 80 degrees to 100 degrees. In some embodiments of the present disclosure, from the top view perspective, an angle between a line L3 connecting the gas outlet 35 with the center O of the upper portion 302 of the cover body 30 and the line L1 connecting the center of the gas intake apparatus 31 with the center O of the upper portion 302 of the cover body 30 is approximately 135 degrees. In some embodiments, the angle may range between 125 degrees to 145 degrees. In some embodiments of the present disclosure, an angle between the line L3 connecting the gas outlet 35 with the center O of the upper portion 302 of the cover body 30 and the line L2 connecting the center the gas intake apparatus 33 with the center O of the upper portion 302 of the cover body 30 is approximately 135 degrees. In some embodiments, the angle may range between 125 degrees to 145 degrees. The arrangement of the gas intake apparatuses 31, 33, and gas outlet 35 allows the gas introduced into the cover body 30 to achieve complete and thorough flow within the interior of the cover body 30.

As abovementioned, the gas intake apparatus 31, 33 is configured to introduce the cooling gas into the interior space of the cover body 30, thereby utilizing the cooling air to dissipate heat and cool the process chamber cap 2 covered by the cover assembly 3, and the gas outlet 35 is configured to expel the gas from the interior space of the cover body 30, thereby also venting the heat dissipated from the process chamber cap 2. However, if the cooling gas introduced into the interior space of the cover body 30 from gas intake apparatuses 31 and 33 flows directly towards the process chamber cap 2 (that is, a direction of the gas flow from the gas intake apparatus 31 may be substantially parallel to the line connecting the gas intake apparatus 31 with the center O of the upper portion 302 of the cover body 30, and a direction of the gas flow from the gas intake apparatus 33 may be substantially parallel to the line connecting the gas intake apparatus 33 with the center O of the upper portion 302 of the cover body 30), then the flows of the gas may create turbulence within the interior space of the cover body 30. As a result, the temperature of the process chamber cap 2, which is to be cooled by the cooling gas, may have uneven temperature distribution.

Figure 3:
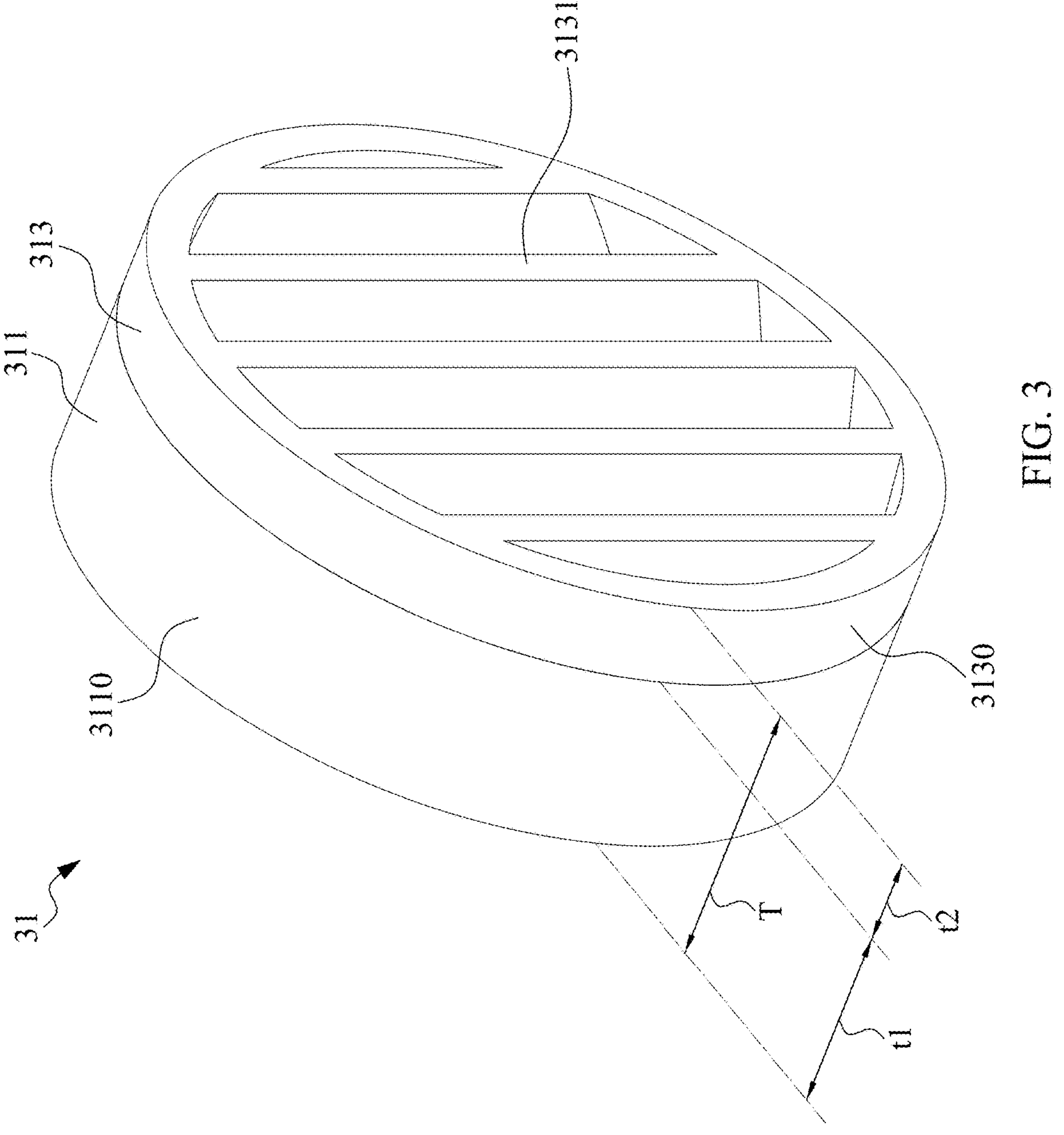
FIG. 3 is a schematic perspective view of a gas intake apparatus, in accordance with some embodiments of the present disclosure.

FIG. 3 is a schematic perspective view of the gas intake apparatus 31, in accordance with some embodiments of the present disclosure. As abovementioned, the gas intake apparatus 31 may be disposed at the sidewall 301 of the cover body 30 and configured to introduce the cooling gas into the interior space of the cover body 30, thereby the heat generated from the process chamber cap 2 could be dissipated by the cooling gas. As shown in FIG. 3, the gas intake apparatus 31 may include a fan device 311 and a deflector 313. In some embodiments of the present disclosure, the fan device 311 and the deflector 313 are assembled with each other. In some embodiments of the present disclosure, the fan device 311 includes an axial flow fan. In some embodiments of the present disclosure, the fan device 311 includes a centrifugal fan. In some embodiments of the present disclosure, the deflector 313 includes a plurality of blades 3131. In some embodiments of the present disclosure, the deflector 313 includes four to nine blades 3131. When the gas intake apparatus 31 is mounted on the sidewall 301 of the cover body 30, the deflector 313 may be directed to face the inner space of the cover body 30, with its blades 3131 positioned vertically, and the fan device 311 may be arranged at the rear of the deflector 313. The fan device 311 is configured to introduce the cooling gas to flow into the interior space of the cover body 30 through the deflector 313. That is, the fan device 311 may generate a flow of the cooling gas to pass through the deflector 313, and the deflector 313 may utilize its blades 3131 to direct the flow of cooling gas from the fan device 311 into the interior space of the cover body 30 in a specific direction.

In some embodiments of the present disclosure, the deflector 313 includes a ring-shaped body 3130 and the plurality of blades 3131 are disposed at the ring-shaped body 3130. In some embodiments of the present disclosure, the fan device 311 includes a main body 3110, and the main body 3110 of the fan device 311 and the ring-shaped body 3130 of the deflector 313 may match with each other. In some embodiments of the present disclosure, the main body 3110 of the fan device 311 has a diameter that is substantially the same as that of ring-shaped body 3130 of the deflector 313. The diameter of the ring-shaped body 3130 of the deflector 313 may range from approximately 146 mm to 173 mm, and similarly, the diameter of the main body 3110 of the fan device 311 may also range from about 146 mm to 173 mm. That is, a diameter of the gas intake apparatus 31 may range from 146 mm to 173 mm. In some embodiments of the present disclosure, the main body 3110 of the fan device 311 has a thickness t1 of about 37 mm to 52 mm. In some embodiments of the present disclosure, the ring-shaped body 3130 of the deflector 313 has a thickness t2 of about 5 mm to 11 mm. That is, a total thickness T of the gas intake apparatus 31 may range from 42 mm to 63 mm. Moreover, a ratio of the diameter of the gas intake apparatus 31 to a total thickness T of the gas intake apparatus 31 may be approximately between 2.3 and 4.

Figure 4A:
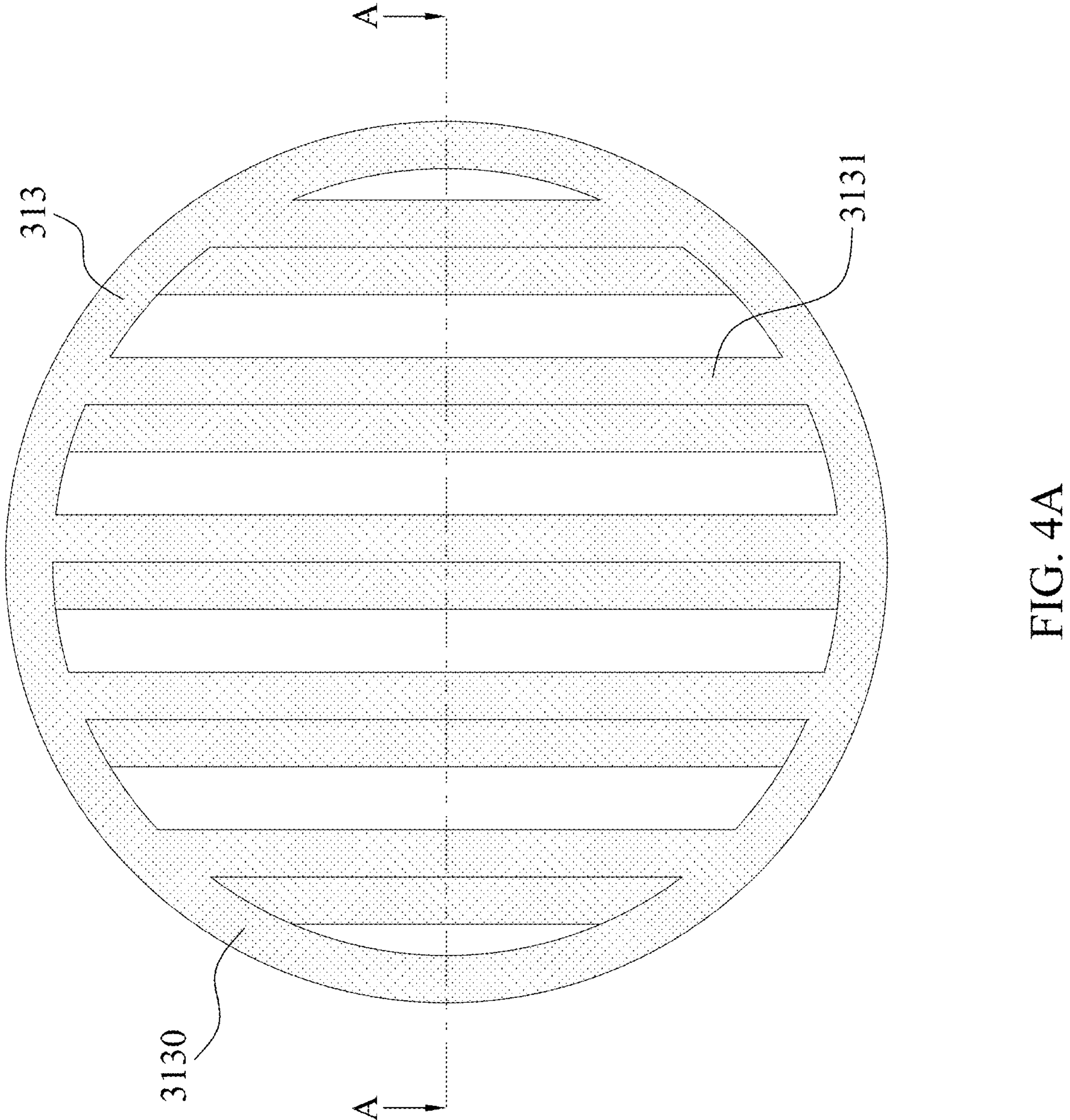
FIG. 4A is a schematic front view of a deflector of a gas intake apparatus, in accordance with some embodiments of the present disclosure.

FIG. 4A is a schematic front view of the deflector 313 of the gas intake apparatus 31, in accordance with some embodiments of the present disclosure. Referring to FIG. 4A, the deflector 313 may include the ring-shaped body 3130, and the blades 3131 may be disposed at the ring-shaped body 3130. The blades 3131 may be arranged in parallel within the ring-shaped body 3130. In some embodiments of the present disclosure, the gas intake apparatus 31 is mounted on the sidewall 301 of the cover body 30, and the blades 3131 vertically extend within the ring-shaped body 3130.

Figure 4B:
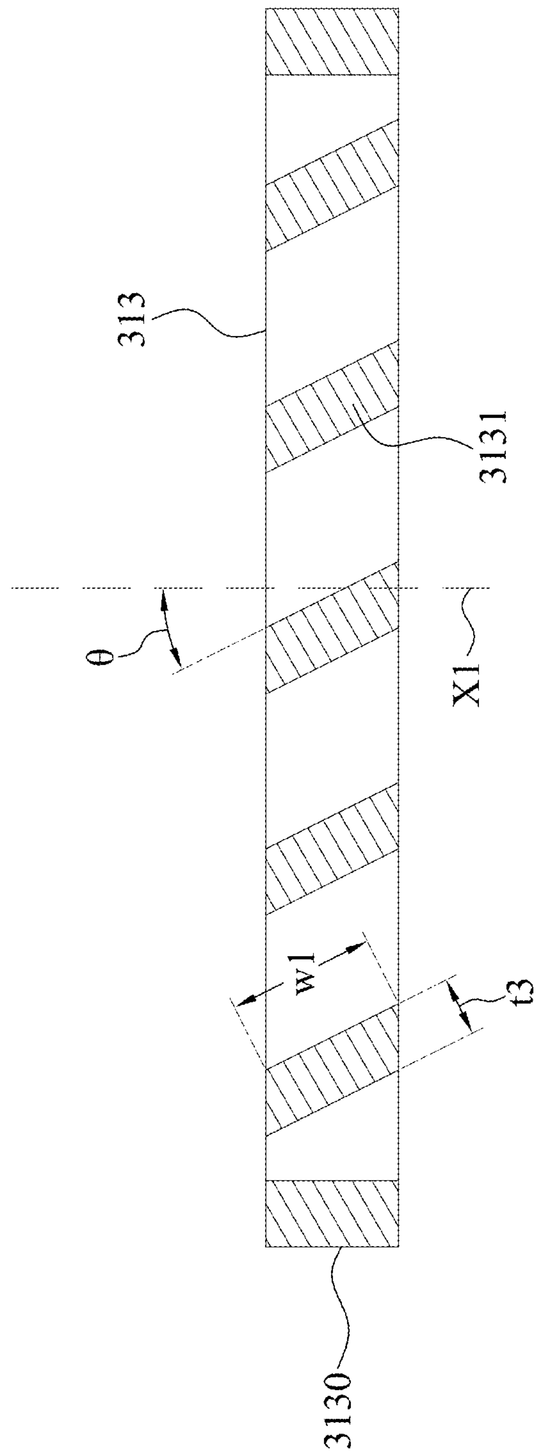
FIG. 4B is a cross-sectional view along line A-A in FIG. 4A.

FIG. 4B is a cross-sectional view along line A-A in FIG. 4A. As shown in FIG. 4B, the blades 3131 may be arranged in parallel within the ring-shaped body 3130. Referring to FIG. 4B, each of the blades 3131 may be positioned at an incline. It can be imagined that the fan device 311, positioned at the bottom side of the deflector 313 as illustrated in FIG. 4B, provides the cooling gas towards the deflector 313, and the cooling gas flows through the deflector 313, exiting from the upper side of the deflector 313. Since the blades 3131 are positioned at an incline, the cooling gas may exit from the upper side of the deflector 313 at an angle. The blade 3131 may be positioned at an angle θ relative to an axis X1, where the axis X1 may be substantially perpendicular to the upper side of the deflector 313. In some embodiments of the present disclosure, the angle θ may be approximately within a range of 42 degrees to 69 degrees. That is, if the fan device 311 provides the cooling gas to pass the deflector 313 along a first direction which may be substantially parallel to the axis X1, the cooling gas may exit from the upper side of the deflector 313 along a second direction, which forms a specific angle with the axis X1. In some embodiments of the present disclosure, the specific angle is substantially equal to the angle θ. That is, the specific angle may be approximately within a range of 42 degrees to 69 degrees.

In some embodiments of the present disclosure, the blade 3131 has a thickness t3 about of 1.5 mm to 7.5 mm. In some embodiments of the present disclosure, the blade 3131 has a width about of 13 mm to 28 mm.

In some embodiments of the present disclosure, the structure of the gas intake apparatus 33 is the same as, or similar to, the structure of the gas intake apparatus 31.

Figure 5:
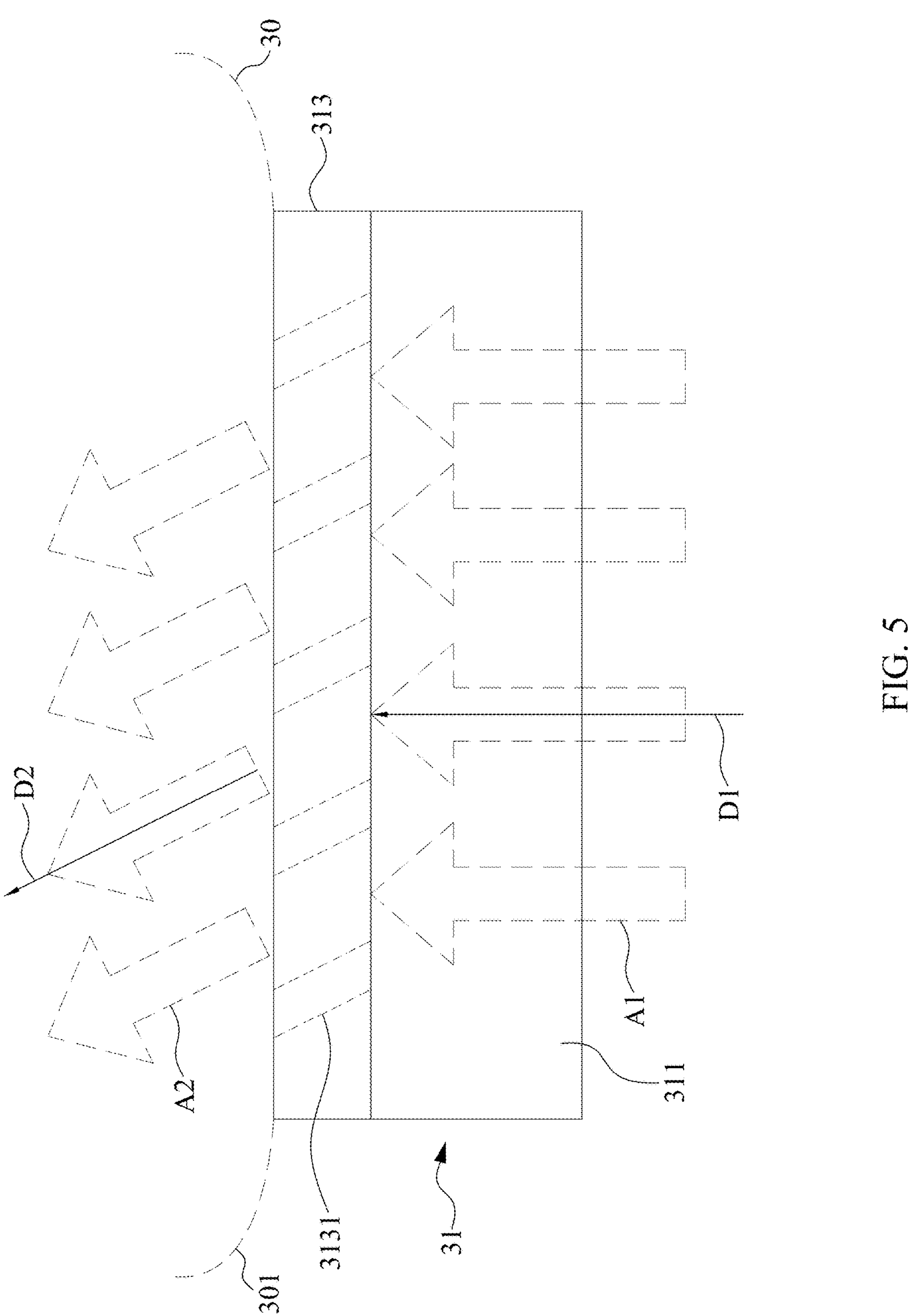
FIG. 5 is a top perspective view of a gas intake apparatus, wherein a fan device provides a gas to pass through a deflector.

Referring to FIG. 5, the gas intake apparatus 31 may be disposed at the sidewall 301 of the cover body 30 and configured to introduce the cooling gas to flow into the interior space of the cover body 30. As shown in FIG. 5, the fan device 311 may provide the cooling gas A1 to flow into the deflector 313 along a direction D1. In some embodiments of the present disclosure, the direction D1 is substantially parallel to the line L1 as illustrated in FIG. 2. In some embodiments of the present disclosure, the direction D1 is substantially parallel to the axis X1 as illustrated in FIG. 4B. When the cooling gas flows through the deflector 313, its flow direction may be changed by the action of the blades 3131 of the deflector 313, which are set at an angle. Then, the cooling gas A2 passing through the deflector 313 flows into the interior space of the cover body 30 along a direction D2. In some embodiments of the present disclosure, the direction D2 is at an angle relative to the line L1 as illustrated in FIG. 2. In some embodiments of the present disclosure, the direction D2 is at an angle relative to the axis X1 as illustrated in FIG. 4B. In some embodiments of the present disclosure, the angle between the direction D2 and the line L1 may be approximately within a range of 42 degrees to 69 degrees. In some embodiments of present disclosure, the angle between the direction D2 and the axis X1 may be approximately within a range of 42 degrees to 69 degrees.

That is, the blades 3131 of the deflector 313 are configured to change the flow direction of the cooling gas, ensuring that the cooling gas entering the interior space of the cover body 30 does not flow directly towards the process chamber cap 2. Instead, it is diverted in a direction that is oblique to the direct path towards the process chamber cap 2, allowing the cooling gas to flow into the interior space of the cover body 30 at an angle.

Figure 6:
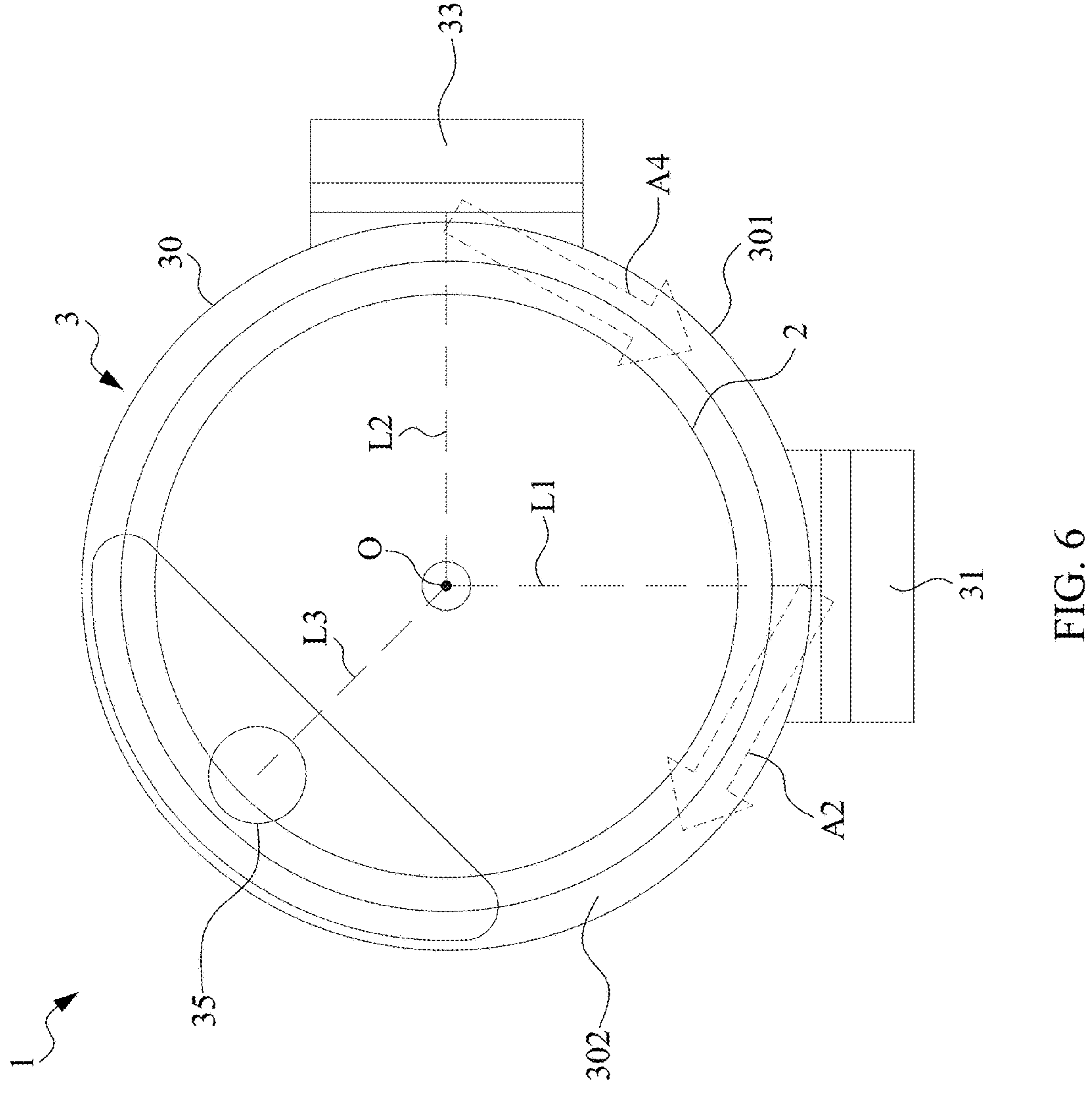
FIG. 6 is a schematic top view of a semiconductor manufacturing tool 1, wherein gas intakes apparatuses of a cover assembly introduce a gas.

FIG. 6 is a schematic top view of the cover assembly 3 of the semiconductor manufacturing tool 1, in accordance with some embodiments of the present disclosure, wherein the cooling gas is provided into the interior space of the cover body 30 of the cover assembly 3 so as to dissipate the heat generated from the process chamber cap 2. As shown in FIG. 6, the cover body 30 of the cover assembly 3 may cover the process chamber cap 2. When the CVD process is performed in the inner space encapsulated by the process chamber cap 2, the inner space of the process chamber cap 2 may generate high temperature, and such high temperature may also cause the temperature of the process chamber cap 2 itself to rise, resulting in significant heat generation. The gas intake apparatuses 31 and 33 may provide the cooling gas into the interior space of the cover body 30 so as to dissipate the heat from the process chamber cap 2 and lower the temperature of the process chamber cap 2 itself.

Referring to FIG. 6, the gas intake apparatus 31 may introduce the cooling gas A2 into the interior space of the cover body 30. Due to the special arrangement of the blades 3131 of the deflector 313 of the gas intake apparatus 31, the cooling gas A2 introduced into the interior space of the cover body 30 from the gas intake apparatus 31 may not flow directly towards the process chamber cap 2. That is, the cooling gas A2 introduced from the gas intake apparatus 31 may flow into the interior space of the cover body 30 at an angle deviating from the axis L1, which connects the center of the gas intake apparatus 31 with the center O of the upper portion 302 of the cover body 30. In other words, from the top view perspective, the cooling gas A2 introduced into the interior space of the cover body 30 from the gas intake apparatus 31 may not flow directly towards the center portion of the process chamber cap 2. In some embodiments of the present disclosure, as shown in FIG. 6, the cooling gas A2 may flow substantially along the inner surface of the sidewall 301 of the cover body 30 and substantially towards the gas outlet 35. In addition, since the cooling gas A2 from the gas intake apparatus 31 may flow into the interior space of the cover body 30 at an angle, the cooling gas A2 may flow along the outer surface of the process chamber cap 2, rather than directly towards the outer surface of the process chamber cap 2.

Referring to FIG. 6 again, the gas intake apparatus 33 may introduce the cooling gas A4 into the interior space of the cover body 30. Since the gas intake apparatus 33 may include a deflector 313, which is the same as or similar to the deflector 313 of the gas intake apparatus 31, the cooling gas A4 introduced into the interior space of the cover body 30 from the gas intake apparatus 33 also may not flow directly towards the process chamber cap 2. That is, the cooling gas A4 introduced from the gas intake apparatus 31 may flow into the interior space of the cover body 30 at an angle deviating from the axis L2, which connects the center of the gas intake apparatus 33 with the center O of the upper portion 302 of the cover body 30. In other words, from the top view perspective, the cooling gas A4 introduced into the interior space of the cover body 30 from the gas intake apparatus 31 may not flow directly towards the center portion of the process chamber cap 2. In some embodiments of the present disclosure, as shown in FIG. 6, the gas intake apparatus 33 may direct the cooling gas A4 to flow substantially along the inner surface of the sidewall 301 of the cover body 30 and substantially towards the gas intake apparatus 31. In some embodiments of the present disclosure, the cooling gas A4 from the gas intake apparatus 33 may flow away from the gas outlet 35. In addition, since the cooling gas A4 may flow into the interior space of the cover body 30 at an angle, the cooling gas A4 may flow along the outer surface of the process chamber cap 2, rather than directly towards the outer surface of the process chamber cap 2.

As shown in FIG. 6, the cooling gas A2 may flow along the inner surface of the sidewall 301 of the cover body 30 and towards the gas outlet 35, and the cooling gas A4 may flow along the inner surface of the sidewall 301 of the cover body 30 and towards the gas intake apparatus 31/away from the gas outlet 35. From the top view perspective, the cooling gas A2 and the cooling gas A4 may flow together in a clockwise direction within the interior space of the cover body 30. Thus, the cooling gas A2 and the cooling gas A4 introduced into the interior space of the cover body 30 by the gas intake apparatuses 31 and 33 may form a laminar flow within the interior space of the cover body 30, rather than creating turbulence. The laminar flow of the cooling gas A2 and the cooling gas A4 may ensure that the temperature of the process chamber cap 2, which is to be cooled by the cooling gas A2 and the cooling gas A4, does not have uneven temperature distribution.

Laminar flow is a smooth and orderly airflow in which the layers of flow are parallel, with little or no cross-flow mixing. Thus, the laminar flow of cooling gas A2 and A4 not only ensures that the temperature of the process chamber cap 2 does not have uneven temperature distribution, but also help maintain a stable internal environment within the cover body 30, reducing the accumulation of dust and other contaminants inside the cover body 30.

Moreover, the dimensions of the components related to the gas intake apparatus 31, 33, such as the number of the blades 3131 of the deflector 313, the diameter of the ring-shaped body 3130 of the deflector 313, the diameter of the main body 3110 of the fan device 311, the thickness of the ring-shaped body 3130 of the deflector 313, the thickness of the main body 3110 of the fan device 311, and the thickness of the blades 3131 of the deflector 313, are effective in achieving the laminar flow of cooling gas A2 and A4 as previously described.

Figure 7:
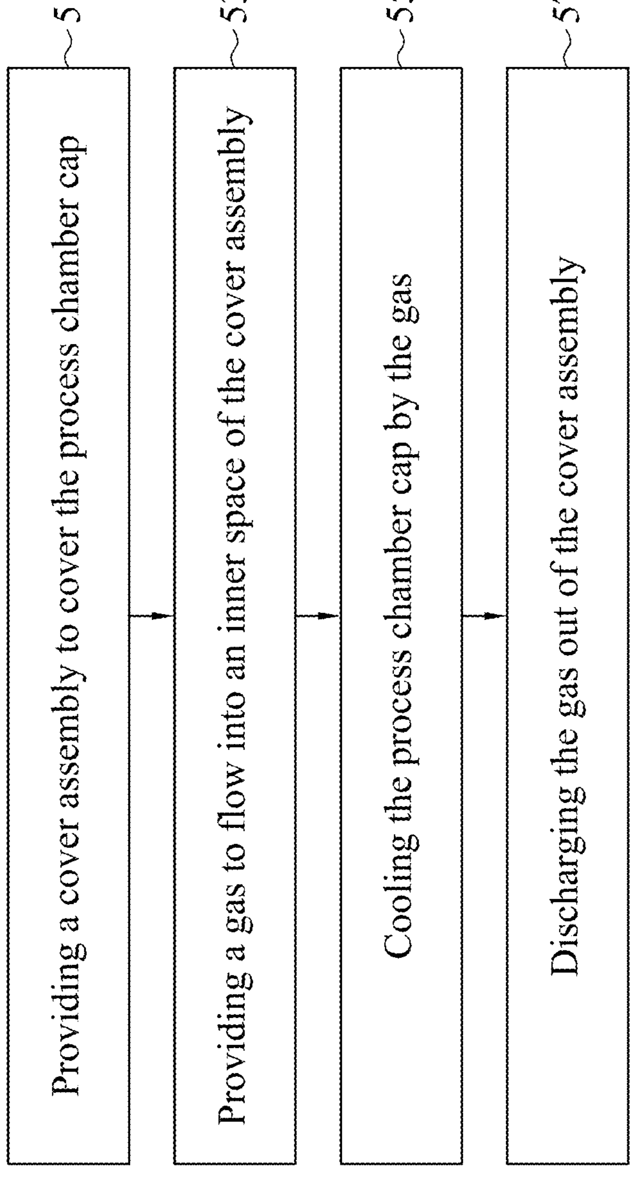
FIG. 7 is a flow chart representing a method for cooling a process chamber cap of a semiconductor manufacturing tool in accordance with an embodiment of the present disclosure.

FIG. 7 is a flow chart representing a method for cooling the process chamber cap 2 of the semiconductor manufacturing tool 1 in accordance with an embodiment of the present disclosure.

In operation 51, the cover assembly 3 is provided to cover the process chamber cap 2. Meanwhile, the CVD process may be performed in the inner space encapsulated by the process chamber cap 2, and the process chamber cap 2 may generate a high temperature due to the CVD process performed inside the process chamber cap 2. In the CVD process, gaseous precursor substances are introduced into the reaction chamber, where these precursors decompose or react under high temperatures, resulting in the deposition of solid materials onto a substrate. The high temperatures involved in this process are crucial, typically requiring a range from several hundred to several thousand degrees to ensure the proper progression of chemical reactions and the correct formation of materials. The cover assembly 3 may include the cover body 30, and the sidewall 301 of the cover body 30 may surround the process chamber cap 2 and the upper portion 302 of the cover body 30 may arranged above the process chamber cap 2. Moreover, the cover assembly 3 may include two gas intake apparatuses 31 and 33. These two gas intake apparatuses 31 and 33 may be disposed at the sidewall of the cover body 30 and may be positioned to face the process chamber cap 2.

In operation 53, the gas intake apparatuses 31 and 33 of the cover assembly 3 may introduce the cooling gas into the interior space of the cover body 30. The gas intake apparatus 31, 33 direct the cooling gas not to flow directly towards the process chamber cap 2. A direction in which the cooling gas flowing into the interior space of the cover body 30 forms an angle with the line L1, L2 connecting the center O of the upper portion 302 of the cover body 30 to the center of the gas intake apparatus 31, 33. In some embodiments of the present disclosure, from the top view perspective, the center O of the upper portion of the cover body 30 may overlap the center of the process chamber cap 2. Thus, the direction in which the cooling gas flowing into the interior space of the cover body 30 forms an angle with the line connecting the center of the process chamber cap 2 to the center of the gas intake apparatus 31, 33.

In some embodiments of the present disclosure, the gas intake apparatus 31 may direct the cooling gas to flow along the inner surface of the sidewall 301 of the cover body 30, and the gas intake apparatus 33 may direct the cooling gas to flow along the inner surface of the sidewall 301 of the cover body 30. In some embodiments of the present disclosure, from the top view perspective, the cooling gas directed by the gas intake apparatus 31 and the cooling gas directed by the gas intake apparatus 33 flow together in a clockwise direction within the interior space of the cover body 30. That is, the cooling gas directed by the gas intake apparatus 31 and the cooling gas directed by the gas intake apparatus 33 form a laminar flow within the interior space of the cover body 30.

In operation 55, the laminar flow of the cooling gas directed by the gas intake apparatus 31 and the cooling gas directed by the gas intake apparatus 33 may flow along the outer surface of the process chamber cap 2, thereby carrying away the heat from the process chamber cap 2, thus reducing the temperature of the process chamber cap 2 itself. Further, the laminar flow of the cooling gas directed by the gas intake apparatus 31 and the cooling gas directed by the gas intake apparatus 33 may ensure an even temperature distribution across the outer surface of the process chamber cap 2.

In operation 57, the cooling gas, having absorbed heat from the process chamber cap 2, may be expelled from the interior space of the cover body 30 to the outside through the gas outlet 35. In this way, the objective of cooling down the process chamber cap 2 is achieved.

It will be further appreciated that the foregoing cover assembly may be used for cooling the process chamber cap of the semiconductor manufacturing tool. The gas intake apparatus of the cover assembly, which may introduce the cooling gas to cool down the apparatus, may form the laminar flow of the cooling gas in the interior space of the cover assembly. The laminar flow of the cooling gas may ensure an even temperature distribution across the outer surface of the process chamber cap 2.

Achieving a uniform temperature distribution across the quartz dome (process chamber cap) in Chemical Vapor Deposition (CVD) equipment is crucial for enhancing the efficiency and quality of the entire process. Firstly, uniform temperature ensures spatial consistency in the chemical reactions occurring within the quartz dome, which is vital for depositing uniform, high-quality films. This consistency not only improves the uniformity of the physical and chemical properties of the films but also contributes to better device performance and reliability.

Secondly, a uniform temperature distribution helps minimize thermal stress within and on the quartz dome, crucial for preventing cracks or fractures due to significant temperature variations. Reducing thermal stress not only extends the lifespan of the quartz dome but also lowers maintenance costs and downtime, thereby increasing production efficiency.

Moreover, uniformity in temperature distribution prevents localized overheating, which can cause inconsistencies in film quality or even damage to the quartz dome. By minimizing hot spots and extreme temperature gradients, the risk of equipment failure or accidents due to overheating is significantly reduced, enhancing workplace safety.

In summary, uniform temperature distribution is essential for ensuring the stability and repeatability of the CVD process, improving product quality, extending equipment life, and ensuring production safety. Thus, achieving a uniform temperature across the quartz dome is a key factor in enhancing the overall process efficiency and product quality in CVD operations.

According to one embodiment of the present disclosure, a gas intake apparatus, configured to provide a gas to flow into an interior space a cover that covers a process chamber cap of a semiconductor manufacturing tool, comprises a deflector configured to be positioned on a sidewall of the cover and a fan device configured to provide the gas to pass through the deflector. The fan device is configured to direct the gas to flow in a first direction towards the deflector. The deflector is configured to direct the gas from the fan device to flow in a second direction into the interior space of the cover. The first direction is different from the second direction.

According to another embodiment, a cover assembly, used for covering a process chamber cap of a semiconductor manufacturing tool, comprises a cover body having a sidewall substantially surrounding the process chamber cap; a first gas intake apparatus disposed on the sidewall of the cover body and configured to provide a gas into an inner space of the cover body; and a gas outlet disposed at an upper of the cover body and configured to expel the gas from the inner space of the cover body. The first gas intake apparatus is configured to direct the gas to flow in a first direction into the inner space of the cover. From a top view perspective, the first direction is angularly offset relative to a first line connecting a center the first gas intake apparatus with a center of upper of the cover body.

According to one embodiment of the present disclosure, a method of cooling a process chamber cap of a semiconductor manufacturing tool, comprises: providing a cover assembly to cover the process chamber cap; providing a gas to flow into an inner space of the cover assembly; and expelling the gas from the inner space of the cover assembly. The gas flowing into the inner space of the cover assembly is free from flowing directly towards the center of the process chamber cap of the semiconductor manufacturing tool.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cover assembly for covering a process chamber cap of a semiconductor manufacturing tool, comprising:

a cover body having a sidewall substantially surrounding the process chamber cap;

a first gas intake apparatus disposed on the sidewall of the cover body and configured to provide a gas into an inner space of the cover body; and a gas outlet disposed at an upper of the cover body and configured to expel the gas from the inner space of the cover body, wherein the first gas intake apparatus is configured to direct the gas to flow in a first direction into the inner space of the cover body; and wherein, from a top view perspective, the first direction is angularly offset relative to a first line connecting a center of the first gas intake apparatus with a center of an upper portion of the cover body;

wherein the first gas intake apparatus comprises a fan device configured to provide a flow of the gas and a deflector configured to deflect the flow of the gas from the fan device.

2. The cover assembly of claim 1, wherein the first gas intake apparatus is configured to direct the gas to flow substantially along the sidewall of the cover body.

3. The cover assembly of claim 1, wherein the deflector comprises a plurality of blades, and wherein the plurality of blades is configured to deflect the flow of the gas when the gas passes through the deflector.

4. The cover assembly of claim 1, further comprising a second gas intake apparatus disposed on the sidewall of the cover body and configured to provide the gas into the inner space of the cover body, wherein the second gas intake apparatus is configured to direct the gas to flow in a second direction into the inner space of the cover body; and wherein, from the top view perspective, the second direction is angularly offset relative to a second line connecting a center of the second gas intake apparatus with the center of the upper portion of the cover body.

5. The cover assembly of claim 4, wherein the second gas intake apparatus is configured to direct the gas to substantially flow towards the first gas intake apparatus.

6. The cover assembly of claim 4, wherein, from the top view perspective, wherein an angle between the first line and the second line ranges between 80 degrees to 100 degrees.

7. The cover assembly of claim 6, wherein, from the top view perspective, an angle between the first line and a third line connecting the gas outlet with the center of the upper of the cover body ranges between 125 degrees to 145 degrees, and an angle between the second line and the third line ranges between 125 degrees to 145 degrees.

8. A cover assembly for covering a process chamber cap of a semiconductor manufacturing tool, comprising:

a cover body having a sidewall substantially surrounding the process chamber cap;

a first gas intake apparatus disposed on the sidewall of the cover body and configured to provide a gas into an inner space of the cover body; and a gas outlet disposed at an upper of the cover body and configured to expel the gas from the inner space of the cover body, wherein the first gas intake apparatus comprises:

a first deflector; and a first fan device configured to provide the gas to pass through the first deflector, wherein the first fan device is configured to direct the gas to flow in a first direction towards the first deflector; wherein the first deflector is configured to direct the gas from the first fan device to flow in a second direction into the interior space of the cover body; and wherein the first direction is different from the second direction.

9. The cover assembly of claim 8, wherein the first deflector comprises a plurality of first blades, and wherein each of the first blades is positioned at an angle relative to the first direction.

10. The cover assembly of claim 9, wherein each of the first blades extends substantially vertically when the first deflector is disposed on the sidewall of the cover body.

11. The cover assembly of claim 9, wherein a number of the plurality of first blades is in a range of approximately 4 to 9.

12. The cover assembly of claim 11, wherein the angle of each of the first blades is approximately within a range of 42 degrees to 69 degrees.

13. The cover assembly of claim 12, wherein each of the first blades has a width of about 13 mm to 28 mm.

14. The cover assembly of claim 13, wherein each of the first blades has a thickness of about 1.5 mm to 7.5 mm.

15. The cover assembly of claim 14, wherein the first deflector comprises a ring-shaped body and the plurality of first blades are disposed at the ring-shaped body, and wherein the ring-shaped body has a diameter of about 146 mm to 173 mm and a thickness of about 5 mm to 11 mm.

16. The cover assembly of claim 15, wherein the first fan device comprises a main body which is configured to match the ring-shaped body of the first deflector, and wherein the main body of the first fan device has a diameter of about 146 mm to 173 mm and a thickness of about 37 mm to 52 mm.

17. The cover assembly of claim 16, wherein a ratio of a diameter of the first gas intake apparatus to a thickness of the first gas intake apparatus is approximately between 2.3 and 4.

18. A cover assembly for covering a process chamber cap of a semiconductor manufacturing tool, comprising:

a cover body having a sidewall substantially surrounding the process chamber cap;

a gas intake apparatus disposed on the sidewall of the cover body and configured to provide a gas to flow into an inner space of the cover body; and a gas outlet disposed at an upper of the cover body and configured to expel the gas from the inner space of the cover body, wherein the gas intake apparatus is arranged such that the gas flowing into the inner space of the cover body flows in a direction angularly offset relative to a line connecting a center of the gas intake apparatus with a center of the process chamber cap.

19. The cover assembly of claim 18, wherein, from a top view perspective, a direction in which the gas flows into the inner space of the cover body forms an angle of approximately 42 degrees to 69 degrees with a line connecting a center of the process chamber cap to a center of the gas intake apparatus.

20. The cover assembly of claim 18, wherein the gas intake apparatus is configured to direct the gas to flow substantially along an inner surface of the sidewall of the cover body.

* * * * *